United States Patent
Bergman et al.

(10) Patent No.: US 11,629,423 B2
(45) Date of Patent: Apr. 18, 2023

(54) ELECTROCHEMICAL DEPOSITIONS OF RUTHENIUM-CONTAINING MATERIALS

(71) Applicant: Applied Materials, Inc., Santa Clara, CA (US)

(72) Inventors: Eric J. Bergman, Kalispell, MT (US); Robert Mikkola, Kalispell, MT (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/411,345

(22) Filed: Aug. 25, 2021

(65) Prior Publication Data
US 2023/0066404 A1 Mar. 2, 2023

(51) Int. Cl.
| | |
|---|---|
| *C25D 3/50* | (2006.01) |
| *C25D 5/02* | (2006.01) |
| *H01L 21/768* | (2006.01) |
| *C25D 5/54* | (2006.01) |
| *H01L 21/288* | (2006.01) |
| *C23C 14/18* | (2006.01) |
| *H01L 21/28* | (2006.01) |
| *C23C 16/455* | (2006.01) |

(52) U.S. Cl.
CPC .......... *C25D 3/50* (2013.01); *C23C 14/18* (2013.01); *C23C 16/45525* (2013.01); *C25D 5/02* (2013.01); *C25D 5/54* (2013.01); *H01L 21/2885* (2013.01); *H01L 21/28114* (2013.01); *H01L 21/76873* (2013.01)

(58) Field of Classification Search
None
See application file for complete search history.

(56) References Cited

U.S. PATENT DOCUMENTS

| | | | |
|---|---|---|---|
| 9,275,894 B2* | 3/2016 | Lin | .................. H01L 21/76802 |
| 2005/0001325 A1* | 1/2005 | Andricacos | ....... H01L 21/76849 |
| | | | 257/E21.585 |
| 2005/0067297 A1 | 3/2005 | Tench et al. | |
| 2005/0218523 A1 | 10/2005 | Dubin | |
| 2008/0261066 A1* | 10/2008 | Deligianni | ............... C25D 3/50 |
| | | | 205/147 |
| 2016/0141178 A1 | 5/2016 | Cohen | |

FOREIGN PATENT DOCUMENTS

| | | |
|---|---|---|
| CN | 212783437 U | 3/2021 |
| WO | 20190791393 A1 | 4/2019 |

OTHER PUBLICATIONS

International Search Report and Written Opinion dated Dec. 8, 2022 in International Patent Application No. PCT/US2022/041278, 12 pages.

* cited by examiner

*Primary Examiner* — Wojciech Haske
(74) *Attorney, Agent, or Firm* — Kilpatrick Townsend & Stockton LLP (57) ABSTRACT

Exemplary methods of electroplating may include providing a patterned substrate having at least one opening, where the opening includes one or more sidewalls and a bottom surface. The methods may also include plating a first portion of ruthenium-containing material on the bottom surface of the opening at a first deposition rate and a second portion of ruthenium-containing material on the sidewalls of the opening at a second deposition rate, where the first deposition rate is greater than the second deposition rate. The methods may be used to make integrated circuit devices that include void-free, electrically-conductive lines and columns of ruthenium-containing materials.

19 Claims, 5 Drawing Sheets

*FIG. 4C* ical depo-
ELECTROCHEMICAL DEPOSITIONS OF RUTHENIUM-CONTAINING MATERIALS

TECHNICAL FIELD

The present technology relates to electrochemical deposition operations in semiconductor processing. More specifically, the present technology relates to systems and methods that perform electrochemical depositions of ruthenium-containing materials on semiconductor structures and in semiconductor packaging.

BACKGROUND

Integrated circuits are made possible by processes which produce intricately patterned material layers on substrate surfaces. After formation, etching, and other processing on a substrate, metal or other conductive materials are often deposited or formed to provide the electrical connections between components. Because this metallization may be performed after many manufacturing operations, problems caused during the metallization may create expensive waste substrates or wafers.

Electroplating is performed in an electroplating chamber with the target side of the wafer in a bath of liquid electrolyte, and with electrical contacts on a contact ring touching a conductive layer, such as a seed layer, on a substrate material. Electrical current is passed through the electrolyte and the conductive layer from a power supply. Metal ions in the electrolyte plate out onto the substrate material, creating a metal layer on the substrate material. When the substrate material has patterned, non-planar features defined across the surface, the metal ions in the electrolyte may not deposit at the same rate at all points on the non-planar features. These variations can challenge electroplating operations, and create deposited materials that include voids and non-uniform thicknesses, among other defects.

Thus, there is a need for improved systems and methods that can be used to produce high quality devices and structures. These and other needs are addressed by the present technology.

SUMMARY

Embodiments of the present technology include electroplating methods that provide a patterned substrate having at least one opening, where the opening includes one or more sidewalls and a bottom surface. The methods also include plating a first portion of ruthenium-containing material on the bottom surface of the opening at a first deposition rate and a second portion of ruthenium-containing material on the sidewalls of the opening at a second rate, where the first deposition rate is greater than the second deposition rate.

In additional embodiments, the first portion of the ruthenium-containing material is plated on a first exposed surface characterized by a first surface concentration of bismuth and the second portion of the ruthenium-containing material is plated on a second exposed surface characterized by a second surface concentration of bismuth that is less than the first surface concentration of bismuth. In further embodiments, the first portion of the ruthenium-containing material includes greater than or about 90 wt. % of ruthenium. In still further embodiments, the methods may include depositing a seed layer on the bottom surface and the one or more sidewalls of the opening before plating the first and second portions of the ruthenium-containing material. In yet additional embodiments, the seed layer is deposited with atomic layer deposition or physical vapor deposition. In more embodiments, the methods may include removing one or more oxide materials from an exposed surface of the seed layer. In still more embodiments, a top portion of the opening is characterized by an opening area that is less than a bottom surface area of the bottom surface of the opening. In still additional embodiments, the opening is a trench or via.

Embodiments of the present technology also include electroplating methods that deposit a seed layer in at least one opening formed in a patterned substrate, where the opening includes one or more sidewalls and a bottom surface. The methods further include contacting the patterned substrate that includes the seed layer with an electrochemical plating fluid that includes greater than or about 0.1 M ruthenium ions and greater than or about $1 \times 10^{-5}$ M bismuth ions. The methods additionally include applying a current to the patterned substrate that includes the seed layer to plate a first portion of the ruthenium-containing material on the bottom surface of the opening at a first deposition rate and a second portion of ruthenium-containing material on the sidewalls of the opening at a second deposition rate, where the first deposition rate is greater than the second deposition rate.

In additional embodiments, the electroplating methods may also include moving the electrochemical plating fluid relative to the patterned substrate that includes the seed layer to create a reduced concentration of bismuth on the sidewalls of the opening relative to the bottom surface of the opening. In further embodiments, the methods may include removing one or more oxide materials from an exposed surface of the seed layer. In still further embodiments, a top portion of the opening is characterized by an opening area that is less than a bottom surface area of the bottom surface of the opening. In more embodiments, the electrochemical plating fluid may be characterized by a pH greater than or about 5. In yet more embodiments, the methods further include applying a voltage of greater than or about $-0.9$V for greater than or about 0.15 minute to the patterned substrate that includes the seed layer in contact with the electrochemical plating bath.

Embodiments of the present technology further include integrated circuit devices that have patterned substrate with at least one opening. The opening includes one or more sidewalls and a bottom surface. A top portion of the opening may be characterized by an opening area that is less than a bottom surface area of the bottom surface of the opening. The circuit devices also include a seed layer in contact with the sidewalls and the bottom surface of the opening. They further include a ruthenium-containing material filling the opening, where the opening filled with ruthenium-containing material is void-free.

In additional embodiments, the ruthenium-containing material that fills the opening includes greater than or about 90 wt. % ruthenium. In further embodiments, the seed layer also includes ruthenium. In still further embodiments, the patterned substrate includes one or more of silicon dioxide, silicon nitride, silicon carbon nitride, and an organic polymer. In more embodiments, the opening is a trench or via. In still more embodiments, the void-free ruthenium-containing material that fills the opening is a redistribution line in the integrated circuit device.

Embodiments of the present technology provide numerous benefits over conventional technology for forming ruthenium-containing, electrically-conductive lines. For example, the embodiments of the present technology permit the formation of ruthenium-containing lines with few or no significant voids that can reduce the conduction of electrical signals through the lines. Additionally, embodiments of the present technology may be performed in a plating chamber in which ruthenium-containing lines and columns are formed by electroplating ruthenium-containing materials into openings on a patterned substrate. These electroplating methods produce the ruthenium-containing lines and columns with a significantly higher throughput compared to other ruthenium deposition technologies such as chemical and physical vapor deposition. These and other embodiments, along with many of their advantages and features, are described in more detail in conjunction with the below description and attached figures.

BRIEF DESCRIPTION OF THE DRAWINGS

A further understanding of the nature and advantages of the disclosed embodiments may be realized by reference to the remaining portions of the specification and the drawings.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the figures, similar components and/or features may have the same numerical reference label. Further, various components of the same type may be distinguished by following the reference label by a letter that distinguishes among the similar components and/or features. If only the first numerical reference label is used in the specification, the description is applicable to any one of the similar components and/or features having the same first numerical reference label irrespective of the letter suffix.

DETAILED DESCRIPTION

Many types of electronic devices that use semiconductor-based integrated circuits have progressed from single chip (i.e., die) packages, which are electronically interconnected through a circuit board, to multiple chips that are stacked or otherwise arrayed in a single package. These multiple-die packages can include dies for memory, logic, micro-electromechanical-systems (MEMS) and sensors, among other functions, and may include system-on-chip (SoC) and system-in-package (SiP) packages. As these multiple-chip packages add more chips that are further miniaturizing, the density of the electrical interconnections (i.e., the interconnect density) between them increases. This has caused the size of those interconnections to decrease. These sizes, commonly measured as the pitch of an electrically-conductive line or via that makes an interconnection between input/output pads on adjacent semiconductor dies, have decreased from several hundred micrometers to 10 μm or less.

The decrease in the pitch size of the interconnects has changed how the connections are formed. For many kinds of increasingly-miniaturized multi-die packages, a conventional solder bump, measuring hundreds of microns in diameter, is too large to form high-density interconnects with pitch sizes of 50 μm or less. In many instances, these high-density interconnects eliminate solder bumps and form a direct metal-to-metal connection between opposite facing lines, vias, and pads of the interconnect.

In most conventional, high-interconnect-density integrated circuit devices, the direct metal-to-metal connections are made with copper. Fabrication methods for copper interconnects have been perfected over decades, and the semiconductor industry has built a large fabrication infrastructure for making copper interconnects. However, the limitations of copper as an interconnect metal are becoming more apparent as the interconnect densities in multi-die packages continue to increase and the processing speed of the integrated circuits in those semiconductor dies also increase. The electrical current passing through a copper interconnect can physically transport the copper outside the boundaries of the interconnect in a process called electromigration. As adjacent interconnects are positioned closer together in high-interconnect-density packages, the copper electromigration is more likely to create electrical crosstalk, or even an electrical short, between the adjacent interconnects. Copper lines and vias also have increased electrical resistance when the volume of the line or via decreases. For conventional copper interconnects having pitch sizes greater than 50 μm, the increased electrical resistance does not appreciably effect copper's ability to transmit electrical signals between integrated circuit dies. However, as the pitch sizes continue to decrease in high-interconnect-density packages, the increased electrical resistance of the copper causes noticeable delays in the speed of the signals transmitted thought the interconnect. The speed delays are creating a growing bottleneck between the increasing processing speeds within a semiconductor die and the slowing signal transmission speeds of the copper interconnects. Thus, chip fabricators are considering other materials to replace at least some of the copper in the electrically-conductive lines, vias, and other interconnect components found in the intermediate packaging between semiconductor dies of multi-die packages.

One alternative metal is ruthenium. Ruthenium is less prone to electromigration than copper. It also demonstrates a significantly lower increase in electrical resistance compared to copper as the volume of the metal decreases. Unfortunately, fabrication methods for ruthenium-containing lines and vias are not as developed as those for forming copper lines and vias. One problem that has been observed while trying to fabricate the ruthenium-containing lines has been the formation of performance-degrading voids in electroplated ruthenium lines. The voids are frequently formed in openings characterized by high aspect ratios (i.e., the ratio of the height of the opening to its width). In conventional technologies, the ruthenium material forms too quickly along the one or more sidewalls of the opening and closes off the top of the opening before enough ruthenium-containing material is deposited on the bottom surface. The truncated bottom-surface deposition leaves a large void in the ruthenium-containing line that can reduce or stop electrical conduction through the line.

Embodiments of the present technology include electrochemical deposition methods of forming ruthenium-containing materials with a reduced volume of voids in openings of a pattered substrate. In many instances, the methods form void-free ruthenium-containing materials in the openings. The methods include contacting the patterned substrate with an electrochemical plating bath that includes ruthenium ions and bismuth ions. The bismuth ions increase the deposition rate of the ruthenium-containing material on the substrate. The methods further include operations to increase the concentration of the bismuth ions on the bottom surface of an opening relative to one or more sidewalls of the opening. The increased concentration of the bismuth ions on the bottom surface increase the deposition rate of the ruthenium-containing material on the bottom surface relative to the side walls. This permits the bottom-up deposition of the ruthenium-containing material from the bottom surface of the opening to be completed before the deposition of ruthenium-containing materials from the sidewalls towards the middle of the opening can prematurely pinch off the top portion of the opening and leave a void in the bottom portion.

Figure 1:
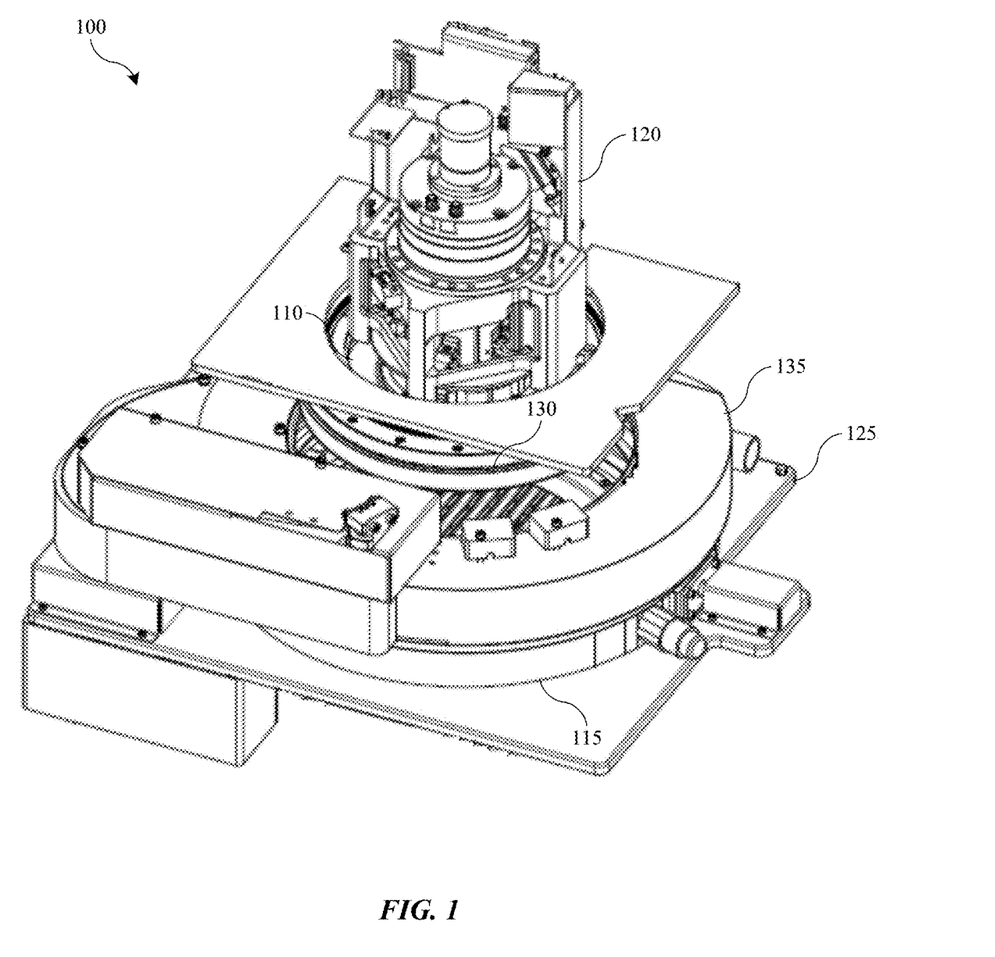
FIG. 1 shows a schematic perspective view of an electroplating system according to some embodiments of the present technology.

FIG. 1 shows a schematic perspective view of an electroplating system 100 that can perform ruthenium electroplating methods according to embodiments of the present technology. Electroplating system 100 illustrates an exemplary electroplating system including a system head 110 and a bowl 115. During electroplating operations, a wafer may be clamped to the system head 110, inverted, and extended into bowl 115 to perform an electroplating operation. Electroplating system 100 may include a head lifter 120, which may be configured to both raise and rotate the head 115, or otherwise position the head within the system including tilting operations. The head and bowl may be attached to a deck plate 125 or other structure that may be part of a larger system incorporating multiple electroplating systems 100, and which may share electrolyte and other materials. A rotor may allow a substrate clamped to the head to be rotated within the bowl, or outside the bowl in different operations. The rotor may include a contact ring, which may provide the conductive contact with the substrate. A seal 130 discussed further below may be connected with the head. Seal 130 may include a chucked wafer to be processed. FIG. 1 illustrates an electroplating system 100 that may include components to be cleaned directly on the platform. In embodiments, the electroplating system 100 further includes an in situ rinse system 135 for component cleaning. In additional embodiments (not shown) an electroplating system may be configured with a platform on which the head may be moved to an additional module where seal or other component cleaning is performed.

Figure 2:
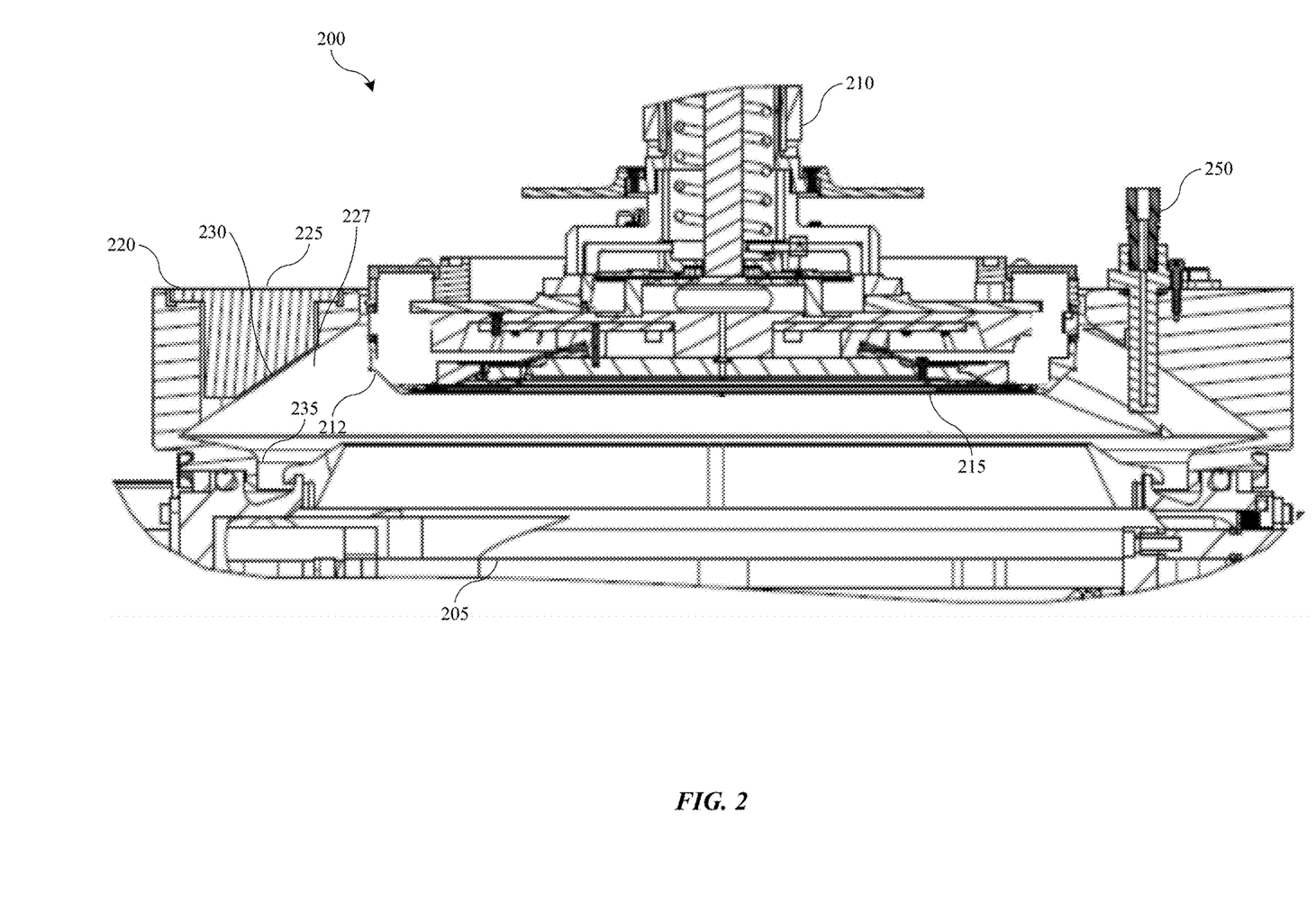
FIG. 2 shows a partial cross-sectional view of an electroplating system according to some embodiments of the present technology.

FIG. 2 shows a partial cross-sectional view of an electroplating chamber that includes an electroplating apparatus 200 according to some embodiments of the present technology. The electroplating apparatus 200 may be incorporated with an electroplating system, including system 100 described above. As illustrated in FIG. 2, a plating bath 205 of an electroplating system is shown along with a head 210 having a substrate 215 coupled with the head. In the embodiment shown, a substrate is coupled with a seal 212 incorporated on the head 210. A rinsing frame 220 may be coupled above the plating bath vessel 205, and may be configured to receive the head 210 into the vessel during plating. Rinsing frame 220 may include a rim 225 extending circumferentially about an upper surface of the plating bath vessel 205. A rinsing channel 227 may be defined between the rim 225 and an upper surface of the plating bath vessel 205. For example, rim 225 may include interior sidewalls 230 characterized by a sloping profile. As described above, rinse fluid slung off a substrate may contact the sidewalls 230, and may be received in a plenum 235 extending about the rim for collection of the rinse fluid from the electroplating apparatus 200.

In embodiments, electroplating apparatus 200 may additionally include one or more cleaning components. The cleaning components may include one or more nozzles used to deliver fluids to or towards the substrate 215 or the head 210. FIG. 2 illustrates one of a variety of embodiments in which improved rinse assemblies may be used to protect the bath and substrate during rinsing operations. In additional embodiments, a side clean nozzle 250 may extend through the rim 225 of the rinsing frame 220 and be directed to rinse seal 212, along with aspects of substrate 215.

Figure 3:
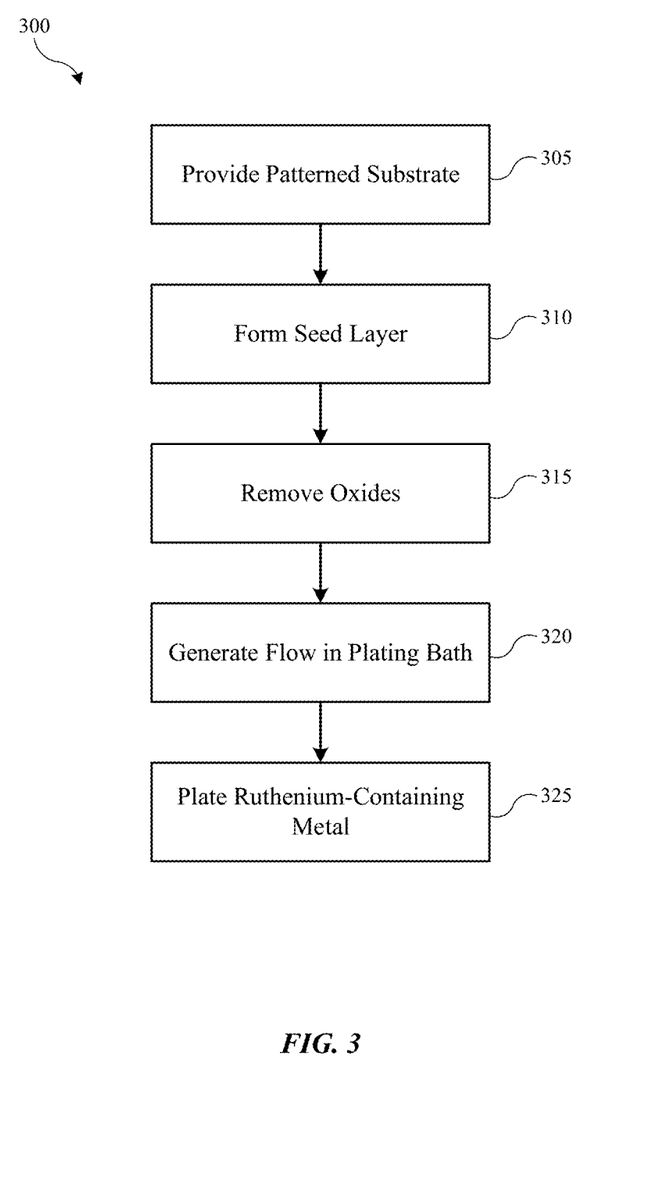
FIG. 3 shows exemplary operations in a method of electroplating according to some embodiments of the present technology.

Embodiments of the above-described systems and chambers may be used to perform embodiments of the present ruthenium electroplating methods. FIG. 3 shows exemplary operations in a method 300 of electroplating a ruthenium-containing material according to embodiments of the present technology. The method 300 may also include one or more operations prior to the initiation of the method, including front end processing, deposition, gate formation, etching, polishing, cleaning, or any other operations that may be performed prior to the described operations. The method may further include a number of optional operations, which may or may not be specifically associated with some embodiments of methods according to the present technology. For example, many of the operations are described in order to provide a broader scope of the processes performed, but are not critical to the technology, or may be performed by alternative methodology as will be discussed further below. Method 300 may describe operations shown schematically in FIGS. 4A-4C, the illustrations of which will be described in conjunction with the operations of method 300. It is to be understood that the figures illustrate only partial schematic views, and a substrate may contain any number of additional materials and features having a variety of characteristics and aspects as illustrated in the figures. Embodiments of method 300 may or may not involve optional operations to develop the semiconductor structure to a particular fabrication operation.

Figure 4A:
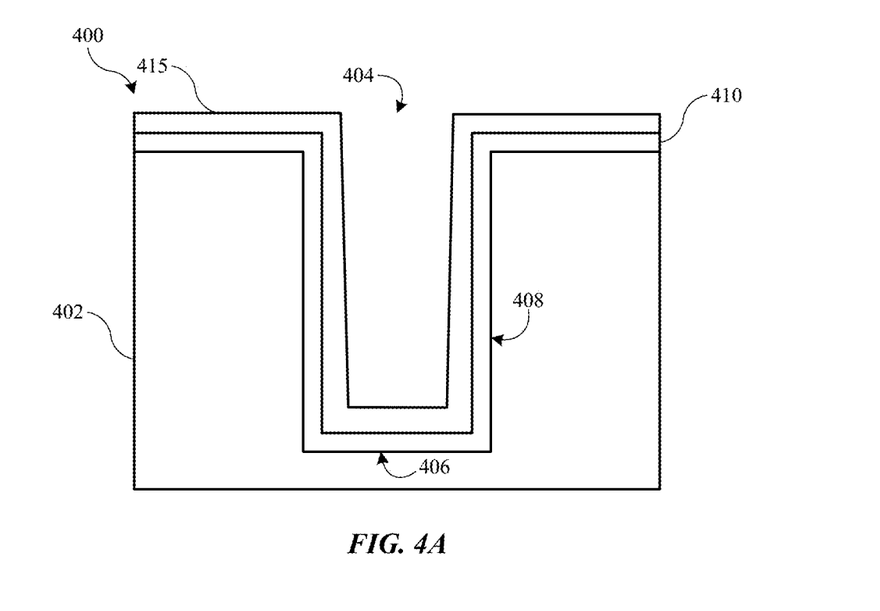
FIGS. 4A-4C show schematic cross-sectional views of a patterned substrate undergoing a plating of ruthenium-containing material according to some embodiments of the present technology.

Embodiments of method 300 include providing a pattered substrate in operation 305. FIG. 4A shows a portion of a patterned substrate 400 that may be included in, for example, an intermediate packaging region of a single-die or multi-die integrated circuit package. The portion of patterned substrate 400 includes at least one opening 404. In embodiments, the opening 404 may include a bottom surface 406 and one or more sidewall surfaces 408. In further embodiments, the opening 404 may be a trench that shapes part of a ruthenium-containing conductive line, such as a redistribution line in an intermediate packaging region. In additional embodiments, the opening 404 may be a via that shapes a ruthenium-containing conductive via or pillar. In still further embodiments, the opening 404 may include one or more of a recess, a step, or an isolation structure, among other kinds of structures.

In embodiments, the patterned substrate 400 may include a dielectric layer 402 into which the opening 404 may be formed. In the embodiment shown in FIG. 4A, the opening 404 terminates in the dielectric layer 402 to leave the bottom surface 406 of the opening made of an exposed surface of the dielectric layer 402. These openings may include trenches that shape part of a ruthenium-containing, electrically-conductive line, such as a redistribution line. In additional embodiments (not shown), one or more openings may extend through the dielectric layer and terminate at an underlying conductive layer, such as a pad layer. In these embodiments, the underlying layer forms the bottom surface of the opening instead of the dielectric layer. These openings may include columnar vias and pillars that electrically connect metal lines and layers in vertically separated planes.

In additional embodiments, the opening 404 may be characterized by a pitch that is less than or about 100 μm, less than or about 75 μm, less than or about 50 μm, less than or about 40 μm, less than or about 30 μm, less than or about 20 μm, less than or about 10 μm, less than or about 5 μm, less than or about 4 μm, less than or about 3 μm, less than or about 2 μm, less than or about 1 μm, or less. In further embodiments, the opening 404 may be characterized by a height-to-width ratio (i.e., an aspect ratio) that is greater than or about 2:1, greater than or about 3:1, greater than or about 4:1, greater than or about 5:1, greater than or about 6:1, greater than or about 7:1, greater than or about 8:1, greater than or about 9:1, greater than or about 10:1, or more.

In additional embodiments, the patterned substrate 400 may be formed by depositing and patterning a photoresist material on at least one layer of dielectric material, and etching the at least one opening into the layer of dielectric material through the patterned photoresist. In further embodiments, the patterned substrate 400 may be formed in at least one layer of a semiconductor material. In more embodiments, the at least one layer of dielectric material may include silicon oxide, silicon nitride, silicon-carbon-nitride, or an organic polymer (e.g., a benzocycloalkane), among other dielectric materials. In still more embodiments, the at least one layer of semiconductor material may include silicon, germanium, or gallium arsenide, among other semiconductor materials.

In further embodiments, the patterned substrate 400 may include a barrier layer 410 that can limit diffusion or interaction of a fill material with the underlying substrate. In embodiments, the barrier layer 410 may include one or more of a refractory metal, a metal oxide, or a metal nitride, among other barrier layer materials. In additional embodiments, the barrier layer 410 may include one or more of tantalum, titanium, or tantalum nitride. The barrier layer 410 may facilitate deposition of a seed layer 415, and may also be or include an adhesion layer to facilitate formation of the seed layer.

Embodiments of method 300 also include forming a seed layer 415 at operation 310. The seed layer 415 may be a thin layer of material that facilitates the growth of the subsequently-plated metal-containing material. In embodiments, the seed layer 415 may be deposited at a uniform rate on all the interior surfaces of the opening 404, including the bottom surface 406 and the sidewall surfaces 408. The seed layer 415 may be a conformal layer that has the same thickness on both the bottom surface 406 and the sidewall surfaces 408. In embodiments, the seed layer 415 may be formed by physical vapor deposition or atomic layer deposition, among other deposition techniques. In additional embodiments, the seed layer 415 may include the same materials that are plated into the opening 404. For example, the seed layer 415 may be or include ruthenium.

In additional embodiments, the seed layer 415 may be formed to a thickness of less than or about 100 nm, less than or about 50 nm, less than or about 25 nm, less than or about 10 nm, less than or about 5 nm, or less. In further embodiments, the formation of the seed layer 415 may provide coverage along certain regions of the opening 404, such as the bottom corners or sidewall surfaces 408 proximate the bottom surface 406 of the opening. The seed layer 415 may be thin enough to avoid pinching-off at the top of the opening that can hinder or prevent the electrodeposition of the ruthenium-containing material into the opening by slowing or barring the ruthenium-containing electrochemical plating fluid from reaching the bottom of the opening 404. It is to be understood that the structural characteristics of the opening 404, including the pitch size aspect ratio of the opening among other structural characteristics, is not intended to be limiting, and any of a variety of other patterned substrates 400 including seed layer materials are similarly encompassed. Other exemplary patterned substrates may include two-dimensional and three-dimensional patterned substrates common in semiconductor manufacturing, and within which an opening or other feature may be formed, and along which a seed layer may be deposited. Additionally, although a patterned substrate that includes high-aspect-ratio openings may benefit from the present technology, the technology may be equally applicable to lower aspect ratio openings and other structures.

Embodiments of method 300 may include removing one or more contaminants from the as-deposited seed layer 415 at operation 315. The one or more contaminants may include metal oxides that form on surfaces of the seed layer 415 that is exposed to oxygen in the aqueous electrochemical plating fluid or directly to air. These metal oxides may include ruthenium oxides, such as ruthenium dioxide ($RuO_2$) that may be formed, at least in part, by the oxidation of ruthenium metal in the seed layer 415. The contaminants may be removed by contacting the as-deposited seed layer 415 with an etchant bath. In embodiments, the etchant bath may include an aqueous solution of an inorganic acid such as hydrochloric acid or sulfuric acid. The etchant bath may include a corrosion inhibitor, such as benzotriazole. In further embodiments, the contaminants may be removed by a plasma, such as an oxygen-containing etch plasma to remove organic materials, an argon- and/or nitrogen-containing plasma to expose a pristine surface, or a hydrogen-containing plasma to reduce surface oxides on the metal-containing surface, among other kinds of plasmas.

Embodiments of method 300 may still further include generating flow in a electrochemical plating fluid in a plating bath at operation 320. In embodiments, the turbulence created by flowing the electrochemical plating fluid around the patterned substrate 400 can create differences in the surface concentration of the bismuth ions in different portions of the at least one opening 404 on the substrate. The surface concentration of the bismuth ions in the top portion of the opening 404, which includes the top portion of the sidewall surfaces 408 of the opening, may be lower because this portion is exposed to plating fluid characterized by more rapid flow. This may counterintuitively reduce or suppress ruthenium deposition that is sought by the processing. In contrast, the surface concentration of bismuth ions in the bottom portion of the opening, which includes the bottom surface 406, may be higher than the top portion because this portion is exposed to plating fluid that is less turbulent. The differences in plating fluid flow rates experienced by different portions of the opening 404 creates a higher surface concentration of bismuth ions on the bottom surface 406 compared to the sidewall surfaces 408 near the top portion of the opening. As noted above, this difference in the surface concentration of the bismuth ions between the top and bottom portions of the opening 404 permits the bottom-up deposition of the ruthenium-containing material from the bottom surface of the opening to be completed before the deposition of ruthenium-containing materials from the sidewalls towards the middle of the opening can prematurely pinch off the top portion of the opening and leave a void in the bottom portion.

In embodiments, the difference in surface concentration of the bismuth ions between the bottom surface 406 of the opening 404 and a top portion of the sidewall surfaces 408 (e.g., less than or about 25% down the height of the opening) may be greater than or about 1%, greater than or about 2%, greater than or about 3%, greater than or about 4%, greater than or about 5%, greater than or about 6%, greater than or about 7%, greater than or about 8%, greater than or about 9%, greater than or about 10%, or more. For example, the surface concentration of the bismuth on the bottom surface 406 of the opening 404 may be greater than or about 1 mmol/cm$^2$, greater than or about 2.5 mmol/cm$^2$, greater than or about 5 mmol/cm$^2$, greater than or about 7.5 mmol/cm$^2$, greater than or about 10 mmol/cm$^2$, or more. Additionally, the surface concentration of the bismuth on a top portion of the sidewall surfaces 408 of the opening 404 may be less than or about 1 mmol/cm$^2$, less than or about 0.75 mmol/cm$^2$, less than or about 0.5 mmol/cm$^2$, less than or about 1 mmol/cm$^2$, less than or about 0.25 mmol/cm$^2$, less than or about 0.1 mmol/cm$^2$, or less.

In some embodiments, the flow may be started before the patterned substrate 400 contacts the electrochemical plating fluid, while in additional embodiments, the flow may be started after the patterned substrate contacts the fluid. In additional embodiments, the flow rate of the electrochemical plating fluid in the plating bath may be greater than or about 1 L/min, greater than or about 2 L/min, greater than or about 3 L/min, greater than or about 4 L/min, greater than or about 5 L/min, greater than or about 6 L/min, greater than or about 7 L/min, greater than or about 8 L/min, greater than or about 9 L/min, greater than or about 10 L/min, or more. In more embodiments, the generation of flow in the electrochemical plating fluid facilitates the transport of plating reactants to the exposed surfaces of the plating materials on the patterned substrate 400. In still more embodiments, the generation of flow in the electrochemical plating fluid may increase the uniformity and adhesion of the plating ruthenium-containing materials on the patterned substrate 400. In embodiments, the flow may be generated in the electrochemical plating fluid by one or more of increasing the volumetric flow of the electrochemical plating fluid to the electroplating chamber, rotating the patterned substrate 400 in the plating fluid in the electroplating chamber, directing the flow of the plating fluid with nozzles, jets, or slots, in the electroplating chamber, agitating the plating fluid in the electroplating chamber with an agitation device, such as a propeller or reciprocating paddle, or raising and lowering the patterned substrate in the plating fluid in the electroplating chamber, among other techniques.

In embodiments, the flow of the electrochemical plating fluid can create different levels of turbulence in different areas of the patterned substrate 400. In areas of the substrate that are closer to the flowing bulk fluid, there is more turbulent flow near the substrate surface and lower rates of adsorption of compounds from the electrochemical plating fluid onto the surface. In areas of the substrate that are more sheltered from the flowing bulk fluid, such as the bottom surface of an opening in the substrate, there is less turbulent flow near the surface and higher rates of adsorption of compounds from the electrochemical plating fluid onto the surface. In embodiments, contact between the patterned substrate 400 and the flowing electrochemical plating fluid increases the concentration of compounds in the plating fluid on surfaces that are more sheltered from the plating fluid and that may have slower plating rates because of they are sheltered. In further embodiments, these sheltered portions of surfaces may include the bottom surface 406 of opening 404 as well as the areas around the corners formed by the bottom surface and sidewall surfaces 408.

The difference in the concentration of at least one component of the electrochemical plating fluid between the more sheltered and exposed portions of the surfaces in the patterned substrate 400 may increase with time until the surfaces reach a saturation point for the component. In further embodiments, this period of time when the patterned substrate 400 may be in contact with the flowing electrochemical plating fluid before significant plating on the substrate has occurred may be called an incubation period. In still further embodiments the incubation period may be greater than or about 0.15 minute, greater than or about 0.5 minutes, greater than or about 1 minute, greater than or about 2 minutes, greater than or about 5 minutes, greater than or about 10 minutes, greater than or about 15 minutes, greater than or about 20 minutes, greater than or about 25 minutes, greater than or about 30 minutes, greater than or about 40 minutes, greater than or about 50 minutes, greater than or about 60 minutes, or more. In yet more embodiments, the incubation period may be less than or about 5 minutes, less than or about 1 minute, less than or about 0.5 minutes, less than or about 0.25 minutes, less than or about 0.1 minute, or less.

A voltage may be applied to the patterned substrate 400 in contact with the flowing plating fluid during the incubation period. The applied voltage may be relatively constant, and may be used to increase the patterned substrate's rate of adsorption of one or more polarized or ionic compounds in the electrochemical plating fluid. In further embodiments, the applied voltage may be applied with a low current density flowing though the patterned substrate to discourage significant plating of the ruthenium-containing material on the substrate during the incubation period. In embodiments, the voltage applied to the patterned substrate 400 may be, in absolute terms, greater than or about 0.5 V, greater than or about 0.6 V, greater than or about 0.7 V, greater than or about 0.8 V, greater than or about 0.9 V, or more.

In embodiments, incubation periods that include applying a voltage to the patterned substrate 400 may create a difference in the surface concentration of an ionic plating accelerator, such as bismuth ions, adsorbed onto the more sheltered and more exposed surfaces of the patterned substrate 400. In additional embodiments, the difference in surface concentration of the plating accelerator between the most sheltered, such as the bottom surface 406 of the opening 404, and most exposed surfaces, such as the top portion of the sidewall surfaces 408 of the patterned substrate 400, may be greater than or about 1%, greater than or about 2%, greater than or about 3%, greater than or about 4%, greater than or about 5%, greater than or about 6%, greater than or about 7%, greater than or about 8%, greater than or about 9%, greater than or about 10%, or more. In still further embodiments, the plating accelerator may accelerate the plating of ruthenium metal on the surface of the seed layer 415 of the patterned substrate 400. In more embodiments, the plating accelerator may be bismuth ions ($Bi^{3+}$) that are adsorbed as bismuth metal onto exposed portions of the seed layer 415. In embodiments, the ruthenium-containing electrochemical plating fluid may be characterized by a concentration of bismuth ions that is greater than or about $1 \times 10^{-6}$ M, greater than or about $1 \times 10^{-5}$ M, greater than or about $1 \times 10^{-4}$ M, 0.001 M, 0.01 M, or more.

In embodiments, the difference in the amount of plating accelerator absorbed by the more sheltered and more exposed surfaces of the patterned substrate 400 creates differences in the plating rates at those portions of the surfaces. In more embodiments, the higher concentration of plating accelerator adsorbed at the bottom surface 406 relative to the portions of the sidewall surfaces 408 around the top of the opening 404 may permit the plated metal to deposit at a faster rate at and around the bottom surface. In yet more embodiments, the faster deposition rate of the plating metal at the bottom surface 406 relative to the upper portions of the sidewall surfaces 408 gives the plating operation a bottom-up character. In still further embodiments, the bottom portion of the metal fill is completed before the plating from the sidewall surfaces have pinched off the top of the opening 404. Thus, the incubation period that creates differences in the surfaces concentrations of the adsorbed plating accelerator between the bottom and top portions of the opening 404 reduce the change that the electrochemical plating fluid is prematurely pinched off from the bottom portion to leave a void in the metal fill of the opening.

Embodiments of method 300 may yet also include plating a ruthenium-containing material into at least one opening 404 of a patterned substrate 400 at operation 325. In embodiments, the electrochemical plating system may transition from the end of an incubation period to an electroplating operation without removing the patterned substrate 400 from the electrochemical plating fluid. In further embodiments, the transition from the incubation period to the electroplating operation may include supplying the patterned substrate 400 with a relatively constant electrical current that reduces ruthenium ions in the plating fluid to ruthenium metal plated on surfaces of the patterned substrate. In still more embodiments, a flow of the electrochemical plating fluid may continue during the plating operation 325.

In embodiments, the electrochemical plating fluid may be an aqueous solution that includes ruthenium ions. In further embodiments, the concentration of ruthenium ions may be greater than or about 0.001 M, greater than or about 0.01 M, greater than or about 0.1 M, greater than or about 0.2 M, greater than or about 0.3 M, greater than or about 0.4 M, greater than or about 0.5 M, greater than or about 0.6 M, greater than or about 0.7 M, greater than or about 0.8 M, greater than or about 0.9 M, greater than or about 1 M, or more. In more embodiments, the electrochemical plating fluid may have a temperature of greater than or about 10° C., greater than or about 20° C., greater than or about 30° C., greater than or about 40° C., greater than or about 50° C., or more. In still further embodiments, the electrochemical plating fluid may include one or more additional compounds to facilitate the plating of the ruthenium-containing material, such as one or more accelerators, one or more levelers, one or more suppressors, and one or more polarizers, among other compounds.

In additional embodiments, the alkalinity of the electrochemical plating fluid can affect the level of difference in the surface concentration of bismuth on the plating ruthenium-containing material. In these embodiments, an increase in the alkalinity of the plating fluid increases the difference in surface concentrations of bismuth on the ruthenium-containing material between the top and bottom portions of an opening. The increasing differential may occur when the plating fluid is characterized by a pH of greater than or about 5, greater than or about 6, greater than or about 7, greater than or about 8, greater than or about 9, greater than or about 10, greater than or about 11, or more. In further embodiments, the pH of the plating fluid may be adjusted by the addition of an alkaline compound to the plating fluid. In more embodiments, the alkaline compound may be a hydroxide compound (e.g., sodium hydroxide, potassium hydroxide) or a oxalate compound (e.g., sodium oxalate, potassium oxalate).

In some embodiments, the electrochemical plating fluid may be characterized as acidic. In embodiments, the electrochemical plating fluid may have a pH of less than or about 5, less than or about 4, less than or about 3, less than or about 2 or less. In further embodiments, electrochemical plating fluid may have a pH of greater than or about 2, greater than or about 3, greater than or about 4, greater than or about 5, greater than or about 6, greater than or about 7, greater than or about 8, greater than or about 9, greater than or about 10, greater than or about 11, greater than or about 12, or more. In yet additional embodiments, the electrochemical plating fluid may have a pH of less than or about 7, less than or about 6, less than or about 5, less than or about 4, less than or about 3, less than or about 2, less than or about 1, or less.

In embodiments, the plating operation 325 may be performed with DC current applied at a particular average current density. In additional embodiments, the average current density may be maintained relatively low, such as less than or about 3.0 mA/cm$^2$, less than or about 2.5 mA/cm$^2$, less than or about 2.0 mA/cm$^2$, less than or about 1.5 mA/cm$^2$, less than or about 1.0 mA/cm$^2$, less than or about 0.5 mA/cm$^2$, or less. By maintaining a low current density, plating growth may be controlled to limit or prevent formation of dendrites, and ensure the additives may be functioning within a nominal current window. Because a direct current may be utilized, peak current may be substantially equal to or less than the average current density.

In additional embodiments, the plating operation 325 may be performed by pulsing a DC power supply delivering pulsed current to the processing chamber and plating bath. Accordingly, the power supply may be operated without pulse reverse, and thus operated in a forward direction throughout the operation, which may ensure only plating and not de-plating occurs. The pulsing may occur at a frequency and duty cycle to increase peak current density during on-times of the power supply. While operating a continuous DC power supply at higher power may cause non-uniform plating that leads to dendritic growth, the present technology may limit the high-power operation to produce an initiation condition that may overcome lower conductivity regions caused by low seed layer coverage or gaps. This may be performed by utilizing an average current density that is maintained similar to or lower than standard electroplating operations.

In more embodiments, the DC power supply may have a duty cycle that is adjusted to reduce the on-time of the power supply. For example, in some embodiments the duty cycle may be maintained at greater than or about 10%, and may be maintained at greater than or about 15%, greater than or about 20%, greater than or about 25%, greater than or about 30%, greater than or about 35%, greater than or about 40%, greater than or about 45%, greater than or about 50%, greater than or about 55%, greater than or about 60%, greater than or about 65%, greater than or about 70%, greater than or about 75%, or higher. Again, as the duty cycle increases and the power supply more closely mimics continuous DC operation, the ions adjacent the seed layer 415 may plate out quickly causing dendrite formation. Accordingly, in some embodiments the duty cycle may be maintained at less than or about 80%, and may be maintained at less than or about 70%, less than or about 60%, less than or about 50%, or less.

By operating the power supply in a pulsed condition at low duty cycle, a peak current density may be increased, while maintaining an average current density low enough to control plating from the bath. In embodiments, the plating operation 325 may maintain an average current density at less than or about 2.0 mA/cm$^2$, less than or about 1.5 mA/cm$^2$, less than or about 1.0 mA/cm$^2$, less than or about 0.5 mA/cm$^2$, or less. However, peak current during on-time operation may be greater than or about 0.5 A, and may be greater than or about 1.0 A, greater than or about 1.5 A, greater than or about 2.0 A, greater than or about 2.5 A, greater than or about 3.0 A, greater than or about 3.5 A, greater than or about 4.0 A, greater than or about 4.5 A, greater than or about 5.0 Å, or higher. Additionally, peak current density may be greater than or about 2 mA/cm$^2$, and may be greater than or about 5 mA/cm$^2$, greater than or about 10 mA/cm$^2$, greater than or about 20 mA/cm$^2$, greater than or about 50 mA/cm$^2$, or higher. While this high density may cause issues during continuous power operations as explained above, in some embodiments of the present technology, the on-time may be maintained at less than or about 500 ms, and may be maintained at less than or about 250 ms, less than or about 100 ms, less than or about 50 ms, less than or about 25 ms, less than or about 10 ms, less than or about 5 ms, less than or about 1 ms, or less, which may ensure controlled plating occurs without dendritic growth.

In still more embodiments, plating operation 325 may be performed for a first period of time during which a first amount of plating of the ruthenium metal may occur. The first period of time may be any amount of time to produce sufficient coverage, and may be greater than or about 0.05 minutes, greater than or about 0.1 minutes, greater than or about 0.25 minutes, greater than or about 0.5 minutes, greater than or about 0.75 minutes, greater than or about 1 minute, greater than or about 2 minutes, greater than or about 5 minutes, greater than or about 10 minutes, or more. The plating of the ruthenium-containing material may be characterized by an total deposition rate of greater than or about 0.1 µm/minute, greater than or about 0.2 µm/minute, greater than or about 0.3 µm/minute, greater than or about 0.4 µm/minute, greater than or about 0.5 µm/minute, greater than or about 0.6 µm/minute, greater than or about 0.7 µm/minute, greater than or about 0.8 µm/minute, greater than or about 0.9 µm/minute, greater than or about 1 µm/minute, or more.

In embodiments, there may be different localized deposition rates for the ruthenium-containing material between a top and bottom portion of the at least one opening 404 in the patterned substrate 400. In further embodiments, the different localized deposition rates may be caused by differences in the surface concentrations of bismuth in the top and bottom portions of the opening 404. As noted above, a first portion of the ruthenium-containing material may be plated on a first exposed surface (e.g., the bottom surface 406) that is characterized by a first surface concentration of bismuth. A second portion of the ruthenium-containing material may be plated on a second exposed surface (e.g., the top portion of the sidewall surfaces 408) that is characterized by a second surface concentration of bismuth that is less than the first surface concentration of bismuth. These differences in the surfaces concentrations of bismuth may cause a localized deposition rate of the ruthenium-containing material in the bottom portion of the opening to be higher than the localized deposition rate along the sidewall surfaces at the top of the opening. In embodiments, the difference in the ruthenium-material plating deposition rate between the top and bottom portions of the opening 404 may be greater than or about 1%, greater than or about 2%, greater than or about 3%, greater than or about 4%, greater than or about 5%, greater than or about 6%, greater than or about 7%, greater than or about 8%, greater than or about 9%, greater than or about 10%, or more. In additional embodiments, the ruthenium-material plating deposition rate at top portion of the opening may be less than or about 0.5 µm/minute, less than or about 0.4 µm/minute, less than or about 0.3 µm/minute, less than or about 0.2 µm/minute, less than or about 0.1 µm/minute, or less. In further embodiments, the ruthenium-material plating deposition rate at bottom portion of the opening may be greater than or about 0.5 µm/minute, greater than or about 0.6 µm/minute, greater than or about 0.7 µm/minute, greater than or about 0.8 µm/minute, greater than or about 0.9 µm/minute, greater than or about 1 µm/minute, greater than or about 1.1 µm/minute, or more.

Figure 4B:
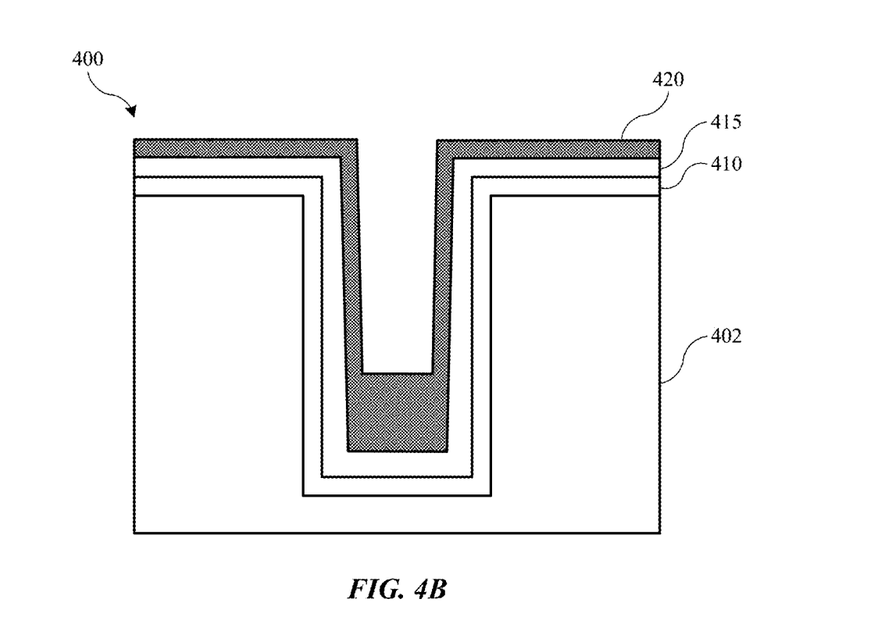

It is to be understood that the operation time and coverage may vary depending on aspects of the feature and amount of buildup to be performed. Although the formation may be uniform, in some embodiments, because the process is performed in the plating bath, the coverage may preferentially occur in regions distal to the surface of the wafer, which may also be the issues insufficiently seeded previously. This may occur because suppressor additives may limit deposition at the neck of the feature, while accelerator additives may facilitate deposition further into the feature. Consequently, the operation may advantageously limit pinching at the neck of the feature or features to be filled. Hence, as shown in FIG. 4B, coverage of the progressing plating of the ruthenium-containing material 420 may be increased along the base and corner regions of the feature, while controlling formation at an entry or neck of the feature.

Figure 4C:
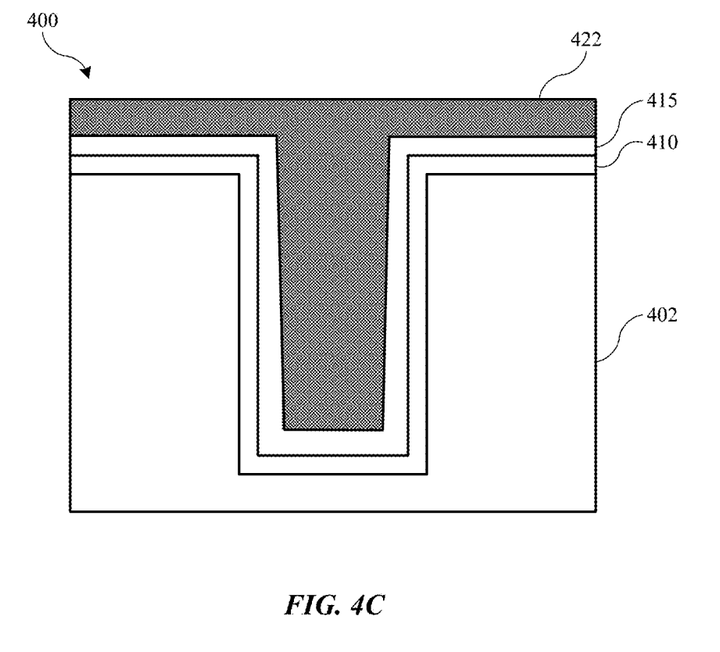

After the pulsing portion of the operation 325 has been completed, the power supply may be switched to a continuous DC current delivery, which may occur for a second period of time during which a second amount of the ruthenium metal may be plated. Accordingly, pulsing may no longer occur, but the average current density may be maintained or slightly increased, which may prevent excessive plate-out during the transition from pulsing to continuous operation. In some embodiments, the average current density during the second operation may be greater than or about the same as the average current density during the first period of time, such as during the pulsed operation. However, the peak current or peak current density may be maintained less than the peak current or peak current density during the first period of time. Thus, while the peak current may exceed 2 A, or more during the first period of time, the peak current may be maintained below or about 2 A during the second period of time, and may be maintained at less than or about 1.5 A during the second period of time, less than or about 1.0 A, less than or about 0.5 A, or less. This may allow plating to be performed up through the feature uniformly, which may limit or prevent void formation. FIG. 4C shows a void-free deposition of the ruthenium-containing material 422 in opening 402 of the patterned substrate 400. In embodiments, a void-free of ruthenium-containing material may be characterizing as lacking any voids or occlusions with a largest dimension of greater than or about 0.1 µm.

The second period of time may also vary depending on aspects of the feature being filled, and in some embodiments the second period of time may be greater than the first period of time. Additionally, in some embodiments, the second period of time may include a number of sub-periods of time in which the current or average current density may be ramped as equilibrium is achieved in plating, and growth through the features may be increased as the feature is filled. For example, embodiments of plating operation 325 may include one or more ramping steps, which may each increase average current density. Each period of time may be any of the time periods noted previously, and each time period may be the same or different in some embodiments. Similarly, the current increase may be a linear increase at each sub-period, or each increase may be more or less than any previous increase in current or current density. In some embodiments during each sub-period, the average current density may be equal to or greater than the average current density during the first period of time. Additionally, a peak current or peak current density may be less than the peak current or peak current density during the first period of time.

In the preceding description, for the purposes of explanation, numerous details have been set forth in order to provide an understanding of various embodiments of the present technology. It will be apparent to one skilled in the art, however, that certain embodiments may be practiced without some of these details, or with additional details. For example, other substrates that may benefit from the wetting techniques described may also be used with the present technology.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included. Where multiple values are provided in a list, any range encompassing or based on any of those values is similarly specifically disclosed.

As used herein and in the appended claims, the singular forms "a", "an", and "the" include plural references unless the context clearly dictates otherwise. Thus, for example, reference to "a material" includes a plurality of such materials, and reference to "the period of time" includes reference to one or more periods of time and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

What is claimed is:

1. An electroplating method comprising:
providing a patterned substrate comprising at least one opening, wherein the opening includes one or more sidewalls and a bottom surface;
plating a first portion of ruthenium-containing material on the bottom surface of the opening at a first deposition rate and a second portion of ruthenium-containing material on the sidewalls of the opening at a second deposition rate, wherein the first deposition rate is greater than the second deposition rate.

2. The electroplating method of claim 1, wherein the first portion of the ruthenium-containing material is plated on a first exposed surface characterized by a first surface concentration of bismuth and the second portion of the ruthenium-containing material is plated on a second exposed surface characterized by a second surface concentration of bismuth that is less than the first surface concentration of bismuth.

3. The electroplating method of claim 1, wherein the first portion of the ruthenium-containing material comprises greater than or about 90 wt. % ruthenium.

4. The electroplating method of claim 1, wherein the method further comprises depositing a seed layer on the bottom surface and the one or more sidewalls of the opening before plating the first and second portions of the ruthenium-containing material.

5. The electroplating method of claim 4, wherein the seed layer is deposited with atomic layer deposition or physical vapor deposition.

6. The electroplating method of claim 4, wherein the method further comprises removing one or more oxide materials from an exposed surface of the seed layer.

7. The electroplating method of claim 4, wherein the seed layer comprises ruthenium.

8. The electroplating method of claim 1, wherein a top portion of the opening is characterized by an opening area that is less than a bottom surface area of the bottom surface of the opening.

9. The electroplating method of claim 1, wherein the opening comprises a trench or a via.

10. The electroplating method of claim 1, wherein the patterned substrate comprises silicon dioxide, silicon nitride, silicon carbon nitride, or an organic polymer.

11. The electroplating method of claim 1, wherein the ruthenium-containing material that fills the opening comprises a redistribution line.

12. The electroplating method of claim 1, wherein the ruthenium-containing material that fills the opening is void-free.

13. A electroplating method comprising:
depositing a seed layer in at least one opening formed in a patterned substrate, wherein the opening includes one or more sidewalls and a bottom surface;
contacting the patterned substrate that includes the seed layer with an electrochemical plating fluid, wherein the electrochemical plating fluid comprises greater than or about 0.1 M ruthenium ions and greater than or about $1\times10^{-5}$ M bismuth ions; and
applying a current to the patterned substrate that includes the seed layer to plate a first portion of ruthenium-containing material on the bottom surface of the opening at a first deposition rate and a second portion of ruthenium-containing material on the sidewalls of the opening at a second deposition rate, wherein the first deposition rate is greater than the second deposition rate.

14. The electroplating method of claim 13, wherein the method further comprises moving the electrochemical plating fluid relative to the patterned substrate that includes the seed layer to create a reduced concentration of bismuth on the sidewalls of the opening relative to the bottom surface of the opening.

15. The electroplating method of claim 13, wherein the method further comprises removing one or more oxide materials from an exposed surface of the seed layer.

16. The electroplating method of claim 13, wherein a top portion of the opening is characterized by an opening area that is less than a bottom surface area of the bottom surface of the opening.

17. The electroplating method of claim 13, wherein the electrochemical plating fluid is characterized by a pH of greater than or about 5.

18. The electroplating method of claim 13, wherein the method further comprises applying a voltage of greater than or about −0.9 V for greater than or about 0.15 minute to the patterned substrate that includes the seed layer in contact with the electrochemical plating bath.

19. The electroplating method of claim 13, wherein the opening comprises a trench or via.

* * * * *